United States Patent
Kim et al.

(10) Patent No.: US 7,642,143 B2
(45) Date of Patent: Jan. 5, 2010

(54) METHOD OF FABRICATING THIN FILM TRANSISTOR HAVING MULTILAYER STRUCTURE AND ACTIVE MATRIX DISPLAY DEVICE INCLUDING THE THIN FILM TRANSISTOR

(75) Inventors: Yong Hae Kim, Gyeonggi (KR); Choong Heui Chung, Daejeon (KR); Jae Hyun Moon, Daejeon (KR); Yoon Ho Song, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 85 days.

(21) Appl. No.: 11/870,809

(22) Filed: Oct. 11, 2007

(65) Prior Publication Data

US 2008/0135837 A1 Jun. 12, 2008

(30) Foreign Application Priority Data

Dec. 7, 2006 (KR) .................. 10-2006-0123955

(51) Int. Cl.
*H01L 21/338* (2006.01)
(52) U.S. Cl. .................. 438/182; 257/E21.205; 257/E29.126
(58) Field of Classification Search .......... 257/E21.411, 257/E29.151; 438/182
See application file for complete search history.

(56) References Cited

U.S. PATENT DOCUMENTS 5,475,238 A 12/1995 Hamada

| 6,362,033 B1* | 3/2002 | Lee et al. ................. 438/182 |
| 2002/0070382 A1* | 6/2002 | Yamazaki et al. ............. 257/72 |
| 2003/0132523 A1* | 7/2003 | Ohtani et al. ............... 257/758 |

FOREIGN PATENT DOCUMENTS

| JP | 10-233511 | 9/1998 |
| JP | 2002-359246 | 12/2002 |

(Continued)

OTHER PUBLICATIONS

Huang-Chung Cheng, et al.; "Fabrication of Low-Temperature Poly-Si Thin Film Transistors with Self-Aligned Graded Lightly Doped Drain Structure;" Electrochemical and Solid-State Letters, 5 (2) pp. G1-G3 (2002).

(Continued)

*Primary Examiner*—A. Sefer
*Assistant Examiner*—Allen L Parker
(74) *Attorney, Agent, or Firm*—Ladas & Parry LLP

(57) ABSTRACT

Provided are a method of fabricating a multilayered thin film transistor using a plastic substrate and an active matrix display device including the thin film transistor fabricated by the method. The method includes: preparing a substrate formed of plastic; forming a buffer insulating layer on the plastic substrate; forming a silicon layer on the buffer insulating layer; patterning the silicon layer to form an active layer; forming a gate insulating layer on the active layer; stacking a plurality of gate metal layers on the gate insulating layer; patterning the plurality of gate metal layers; and etching a corner region of the lowest gate metal layer formed on the gate insulating layer of the patterned gate metal layers. Accordingly, a gate metal is formed which includes a multilayered gate metal layer and has an etched corner region, thereby reducing an electric field of the corner to reduce a leakage current of the TFT.

14 Claims, 9 Drawing Sheets

FOREIGN PATENT DOCUMENTS

| | | |
|---|---|---|
| KR | 97-11965 | 3/1997 |
| KR | 1019980023376 | 7/1998 |
| KR | 1020000032041 | 6/2000 |
| KR | 1020030089458 | 11/2003 |
| KR | 1020060019821 | 3/2006 |
| KR | 1020060079711 | 7/2006 |

OTHER PUBLICATIONS

Kyung Wook Kim, et al.; "Performance improvement of polycrystalling thin-film transistor by adopting a very thin amorphous silicon buffer;" Journal of Non-Crystalline Solids 266-269 (2000) pp. 1265-1269.

* cited by examiner

FIG. 3

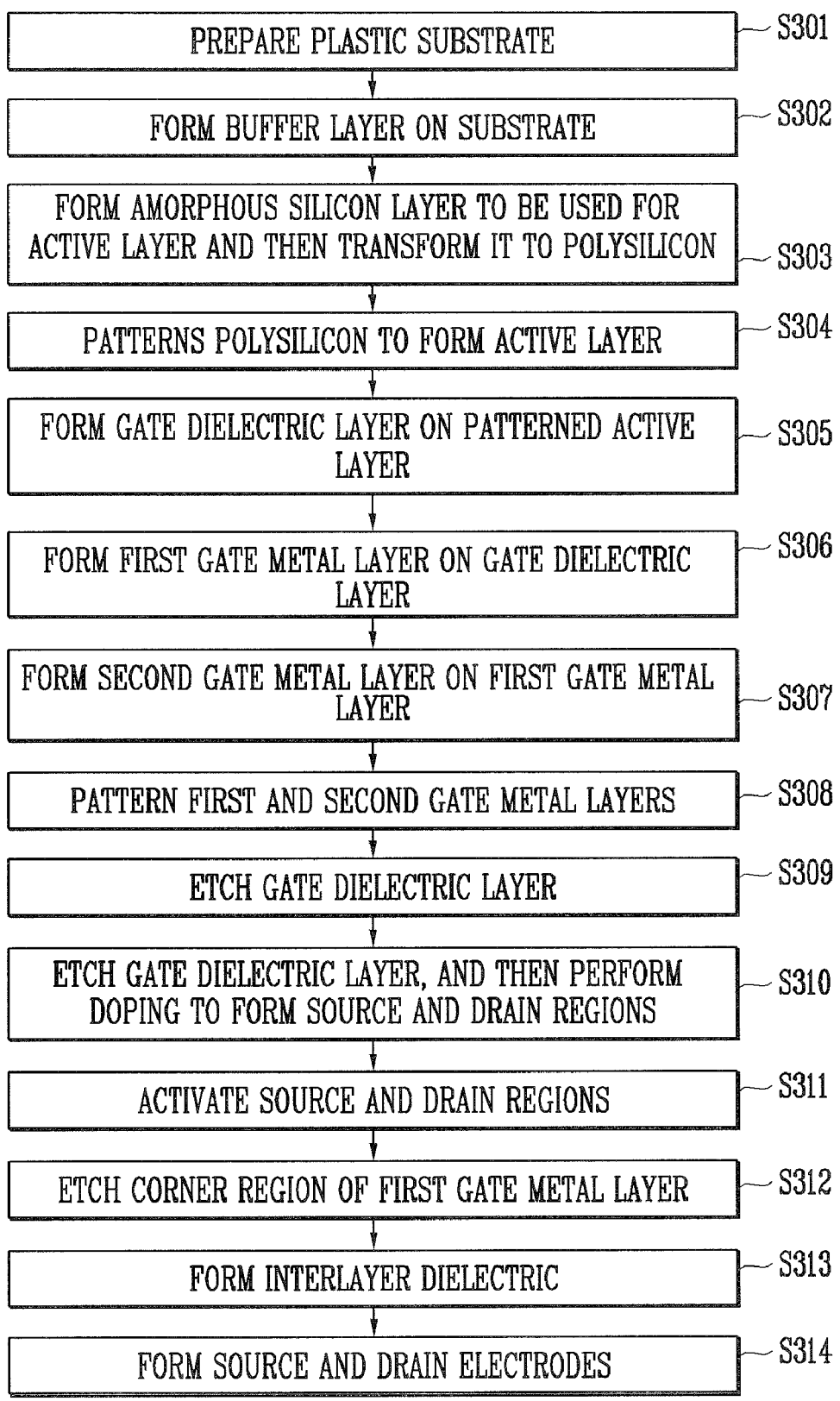

- S301 PREPARE PLASTIC SUBSTRATE
- S302 FORM BUFFER LAYER ON SUBSTRATE
- S303 FORM AMORPHOUS SILICON LAYER TO BE USED FOR ACTIVE LAYER AND THEN TRANSFORM IT TO POLYSILICON
- S304 PATTERNS POLYSILICON TO FORM ACTIVE LAYER
- S305 FORM GATE DIELECTRIC LAYER ON PATTERNED ACTIVE LAYER
- S306 FORM FIRST GATE METAL LAYER ON GATE DIELECTRIC LAYER
- S307 FORM SECOND GATE METAL LAYER ON FIRST GATE METAL LAYER
- S308 PATTERN FIRST AND SECOND GATE METAL LAYERS
- S309 ETCH GATE DIELECTRIC LAYER
- S310 ETCH GATE DIELECTRIC LAYER, AND THEN PERFORM DOPING TO FORM SOURCE AND DRAIN REGIONS
- S311 ACTIVATE SOURCE AND DRAIN REGIONS
- S312 ETCH CORNER REGION OF FIRST GATE METAL LAYER
- S313 FORM INTERLAYER DIELECTRIC
- S314 FORM SOURCE AND DRAIN ELECTRODES

METHOD OF FABRICATING THIN FILM TRANSISTOR HAVING MULTILAYER STRUCTURE AND ACTIVE MATRIX DISPLAY DEVICE INCLUDING THE THIN FILM TRANSISTOR

CROSS-REFERENCE TO RELATED APPLICATION

This application claims priority to and the benefit of Korean Patent Application No. 2006-123955, filed on Dec. 7, 2006, the disclosure of which is incorporated herein by reference in its entirety.

BACKGROUND

1. Field of the Invention

The present invention is related to an active matrix display device formed on a plastic substrate and a method of fabricating the same, and more particularly, to a method of fabricating a thin film transistor including a multilayered gate electrode and an active matrix display device including the thin film transistor.

The present invention has been produced from the work supported by the IT R&D program of MIC (Ministry of Information and Communication)/IITA (Institute for Information Technology Advancement) [2005-S070-02, Flexible Display] in Korea.

2. Discussion of Related Art

FIG. 1 is a side cross-sectional view of a conventional active matrix display device.

Referring to FIG. 1, the conventional active matrix display device 100 includes a thin film transistor (TFT) formed on a glass substrate 110, and a capacitor and an organic light emitting diode (OLED) which are electrically connected to the TFT.

The TFT constituting the active matrix display device 100 includes a buffer insulating layer 120 formed on the glass substrate 110, an active layer 130 formed on the buffer insulating layer 120 and having source and drain regions 132 and a channel region 131, a gate insulating layer 140 formed on the active layer 130, a gate electrode 150 formed on the gate insulating layer 140, an interlayer dielectric 160 formed on the gate electrode 150, and source and drain electrodes 170 in contact with the source and drain regions 132 through a contact hole 161 formed on the interlayer dielectric 160.

When the active matrix display device 100 is fabricated on the glass substrate 110, in particular, when the TFT is fabricated, the doping profile of the active region 131 of the active layer 130 can be adjusted using lithography equipment to form a lightly doped drain (LDD).

However, when the active matrix display device is formed of a plastic substrate, the plastic substrate, unlike the glass substrate, is apt to be thermally deformed, so that metal of a gate metal layer is broken by stress due to a post annealing process when the relatively thick gate metal layer is deposited on the plastic substrate. When several layers need to be aligned in consideration of the thermal deformation of the plastic substrate, overlay accuracy becomes severely worse so that it is difficult to form an LDD without using a self-alignment process.

Further, according to a structure generated by etching of both sides of the gate metal and dopant diffusion due to subsequent laser activation for forming the self-aligned LDD on the plastic substrate (see "Fabrication of Low-Temperature Poly-Si Thin Film Transistor with Self-Aligned Graded Lightly Doped Drain Structure," Electrochemical and Solid-State Letters, Huang-Chung Cheng), it is difficult to adjust the doping profile, and not only a leakage current but also a driving current is decreased.

Depositing thin amorphous silicon on polysilicon to form a dual active structure (see "Performance improvement of polycrystalline thin film transistor by adopting a very thin amorphous silicon buffer," J. Non-Crystalline Solids, Kyung Wook Kim) requires a gate dielectric of high quality to be formed and amorphous silicon of good quality to be formed at a low temperature.

SUMMARY OF THE INVENTION

The present invention is directed to an active matrix display device including multilayered gate metal layers and etching a corner of at least one gate metal layer of the multilayered gate metal layers to reduce a leakage current in a TFT region, and a method of fabricating the same.

One aspect of the present invention provides a method of fabricating a thin film transistor, which includes: preparing a substrate formed of plastic; forming a buffer insulating layer on the plastic substrate; forming a silicon layer on the buffer insulating layer; patterning the silicon layer to form an active layer; forming a gate insulating layer on the active layer; stacking a plurality of gate metal layers on the gate insulating layer; patterning the plurality of gate metal layers; and etching a corner region of the lowest gate metal layer formed on the gate insulating layer of the patterned gate metal layers.

The method may further include etching a corner region of the highest gate metal layer when the number of the gate metal layers is more than three. The highest gate metal layer of the plurality of gate metal layers may be formed of a material having a high reflectivity such as Al, Ag, an Al alloy, or an Ag alloy. The gate metal layer in direct contact with the lowest gate metal layer of the plurality of gate metal layers may be formed of a different material from the lowest gate metal layer.

Another aspect of the present invention provides an active matrix display device comprising a thin film transistor fabricated by the method according to one aspect of the present invention, and a capacitor and an organic light emitting diode which are electrically connected to the thin film transistor.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIG. 3 is a block diagram illustrating steps of the process of FIGS. 2A to 2E;

DETAILED DESCRIPTION OF PREFERRED EMBODIMENTS

Hereinafter, embodiments of the present invention will be described in detail with reference to the accompanying drawings.

FIGS. 2A to 2E are views illustrating a process of fabricating a TFT in accordance with a first embodiment of the present invention, and FIG. 3 is a block diagram illustrating steps of the process of FIGS. 2A to 2E.

Figure 1:
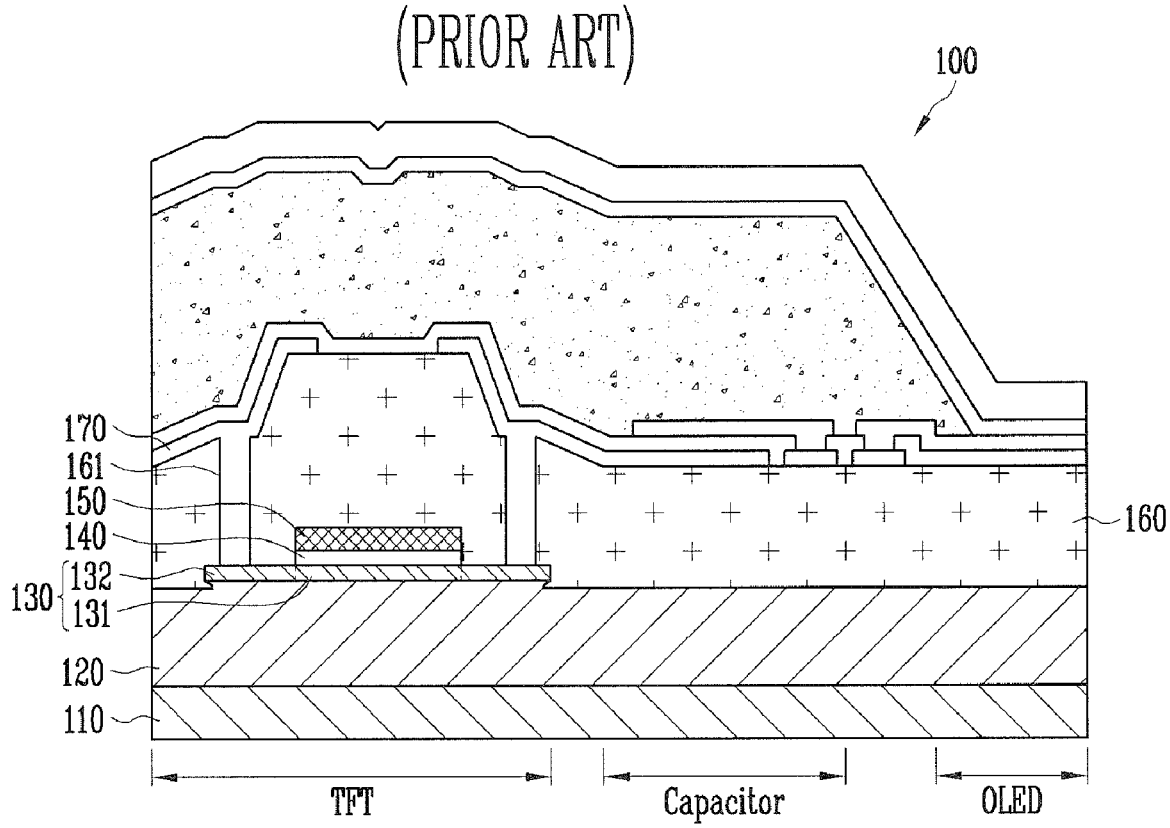
FIG. 1 is a side cross-sectional view of a conventional active matrix display device.
Figure 2A:
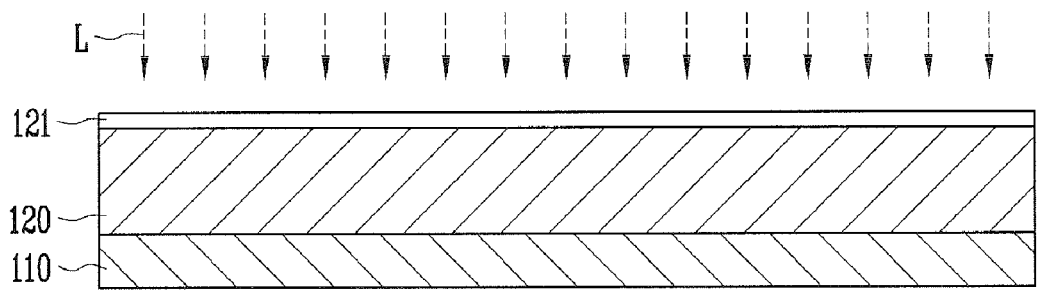
FIGS. 2A to 2E are views illustrating a process of fabricating a TFT in accordance with a first embodiment of the present invention.

Referring to FIGS. 2A and 3, in order to fabricate an active matrix display device 200 according to the present invention, a plastic substrate 110 is first prepared (S301). A buffer insulating layer 120 is formed on the plastic substrate 110 (S302). The buffer insulating layer 120 may be formed of oxide or nitride. After amorphous silicon to be used for an active layer is deposited on the substrate 110 where the buffer insulating layer 120 is already formed, a solid crystallization method using a laser (L:↓ ↓) or the like is employed to obtain a transformed polysilicon layer 121 (S303).

Figure 2B:
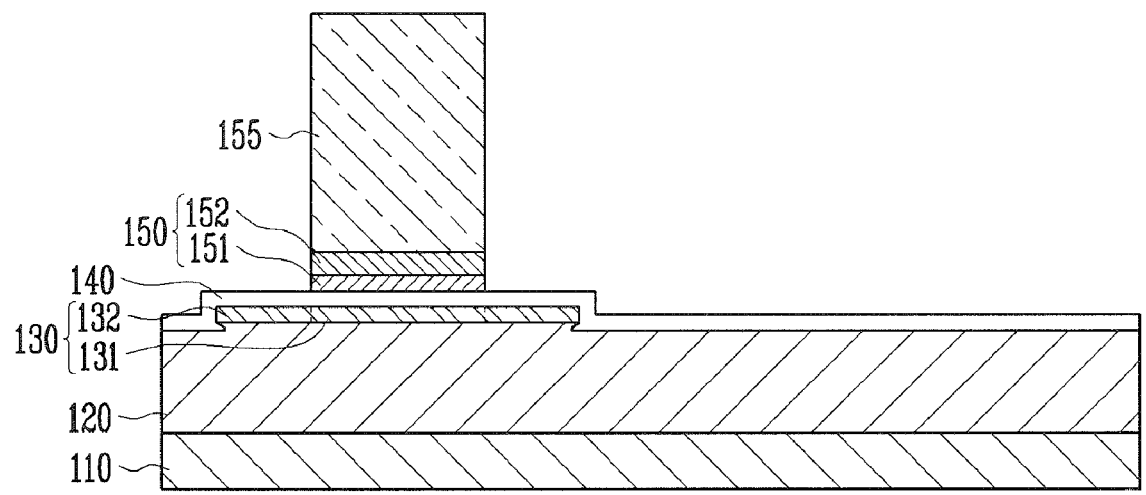

In the next step, referring to FIG. 2B, the transformed polysilicon layer 121 is patterned to form an active layer 130 where a channel region 131 and source and drain regions 132 are to be formed (S304). A gate dielectric layer 140 is deposited on the patterned active layer 130 (S305). A multilayered gate metal layer 150 is then formed on the gate dielectric layer 140. The gate metal layer 150 is composed of a first gate metal layer 151 and a second gate metal layer 152 in the present embodiment, the first gate metal layer 151 is formed on the gate dielectric layer 140 (S306), and the second gate metal layer 152 is formed on the first gate metal layer 151 (S307). The first gate metal layer 151 must be deposited to a thickness enough to endure a post annealing process. The first gate metal layer 151 may be deformed when the deposited first gate metal layer 151 is too thick, so that it is deposited to a thickness of about 100 Å to about 300 Å. Any one of chromium (Cr) and molybdenum (Mo) is used for the first gate metal layer 151 in the first embodiment. The deposition thickness of the second gate metal layer 152 formed on the first gate metal layer 151 is adjusted so as to have source and drain resistances meet a design specification, and is preferably 1000 Å to 3000 Å. At this time, the second gate metal layer 152 is preferably formed of a material having a good reflectivity with respect to laser light compared to the first gate metal layer 151. Any one of silver, aluminum, a silver alloy, and an aluminum alloy, which have good reflectivities, is used for the second gate metal layer 152, and aluminum (Al) is used for depositing the second gate metal layer 152 in the present embodiment. Also, the first and second gate metal layers 151 and 152 have to have good wet etching selectivities.

Referring to FIG. 2B, after a photosensitive layer 155 is deposited on the second gate metal layer 152, a photo process is used to pattern the first gate metal layer 151 and the second gate metal layer 152 (S308). At this time, the gate dielectric layer 140 is patterned together. In other words, after the photosensitive layer 155 is formed by a spin-coating method, the photo process is used to etch the second gate metal layer 152 and the first gate metal layer 151, so that the first and second gate metal layers 151 and 152 are patterned in the present embodiment.

Figure 2C:
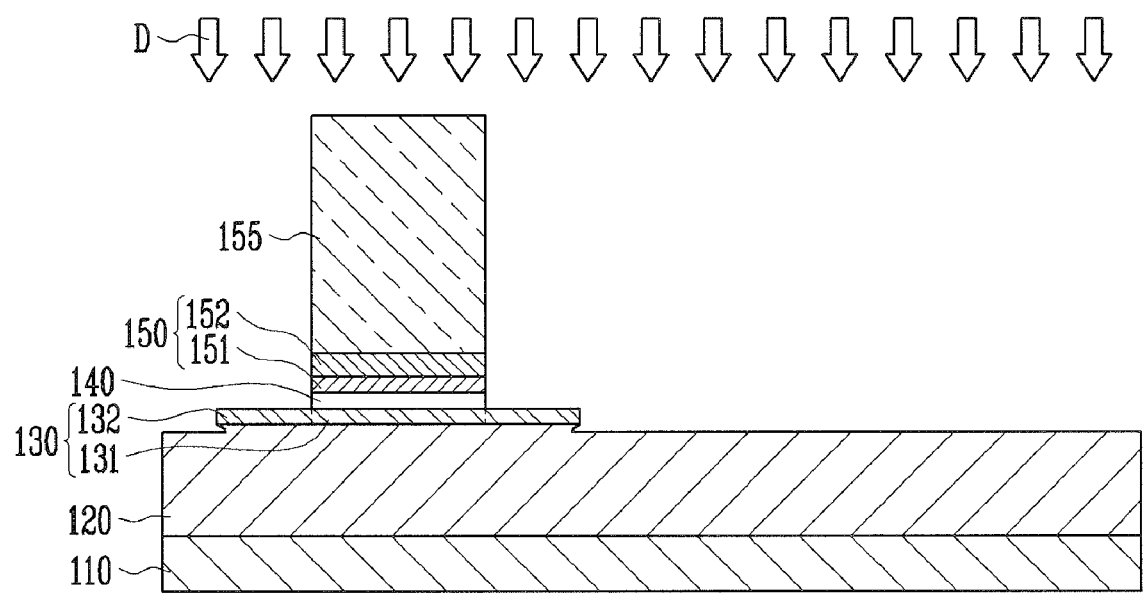
Figure 2D:
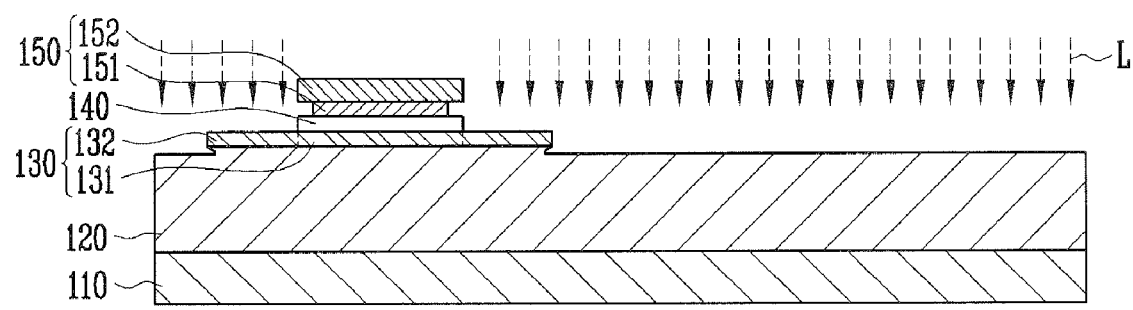

In the next step, referring to FIGS. 2C and 2D, the gate dielectric layer 140 is etched. A doping process (D) is performed after the gate dielectric layer 140 is etched (S309), so that doped source and drain regions 132 are formed (S310). Ion shower doping is performed in the present embodiment. The photosensitive layer 155 is removed in the next step, and after the photosensitive layer 155 is removed, an activation step using the laser L is performed to activate the doped source and drain regions 132 (S311). The patterned first gate metal layer 151 is selectively wet-etched (S312). During the etching process, since the first gate metal layer 151 is deposited to a thin thickness, the first gate metal layer must be etched for a longer time, e.g., about 5 minutes to about 30 minutes, than the known etching rate.

Figure 2E:
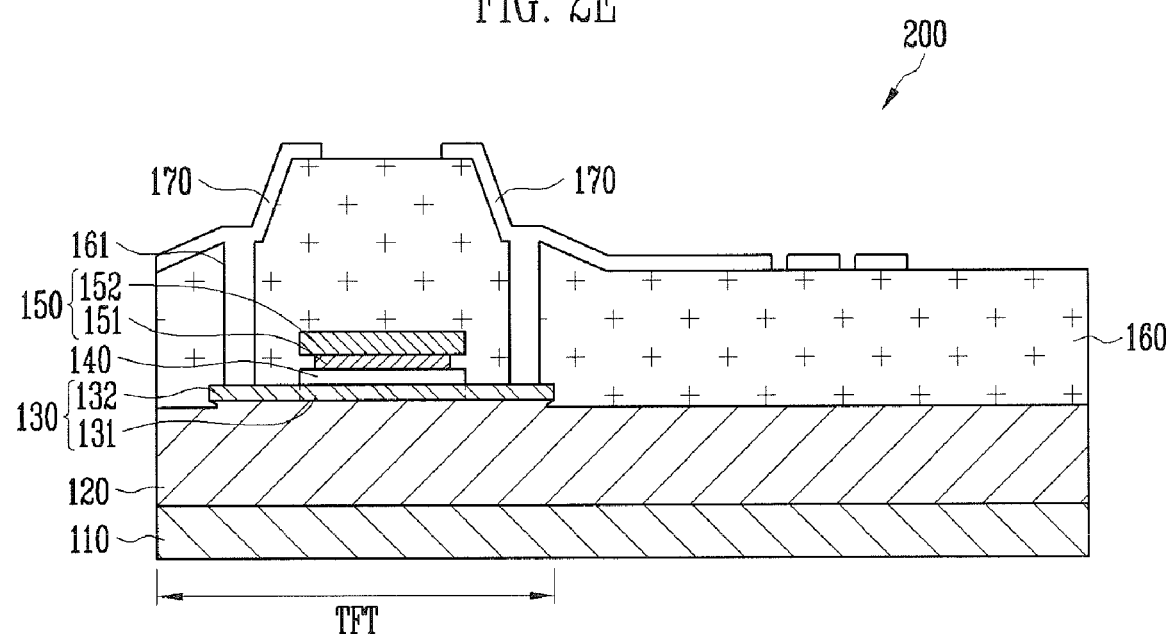

Referring to FIG. 2E, an interlayer dielectric (ILD) 160 is formed on the gate metal layer 150 (S313). After a contact hole 161 is formed in the ILD 160, a source and drain metal 170 is deposited on the ILD 160 to be in contact with the source and drain regions 132 through the contact hole 161 (S314). Accordingly, a TFT is fabricated. Although not described and illustrated in the present embodiment and the drawings, a capacitor and an OLED may be fabricated along with the TFT to fabricate an active matrix display device as in the conventional method.

Figure 4:
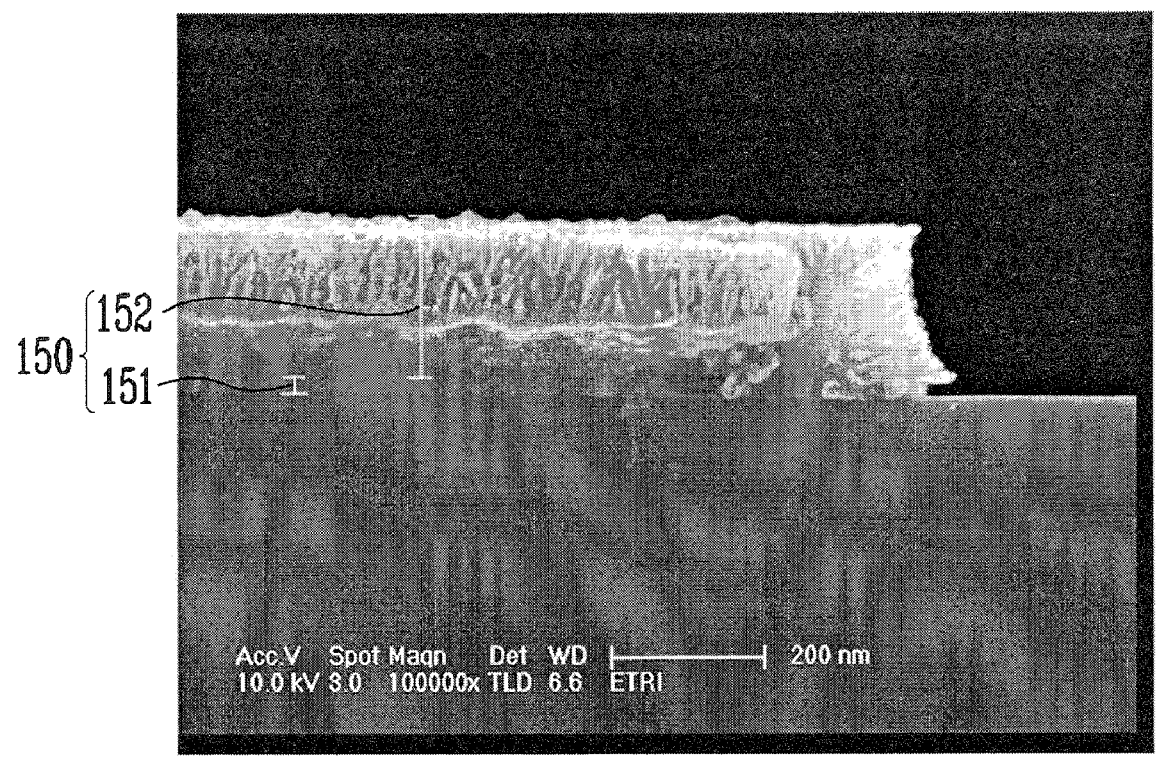
FIG. 4 is a Scanning Electron Microscope (SEM) picture of an active matrix display device fabricated using chromium for a first gate metal layer and aluminum for a second gate metal layer in accordance with the present invention.

FIG. 4 is a SEM picture of a region of an active matrix display device including a dual gate metal layer in accordance with an embodiment of the present invention. In the present embodiment, Cr is used for the first gate metal layer 151 and Al is used for the second gate metal layer 152 in the dual gate metal layer 150. Referring to FIG. 4, the first gate metal layer 151 with a depressed corner is formed on the substrate 110. The second gate metal layer 152, which has a relatively thick thickness compared to the first gate metal layer 151, is formed on the first gate metal layer 151. In the present embodiment, the first gate metal layer of Cr 151 having a thickness of 21.6 nm is deposited, and the second gate metal layer of Al 152 having a thickness of 232 nm is deposited. When wet etching is performed on the first gate metal layer 151 for 10 minutes after each of the gate metal layers is deposited as in the present embodiment, about 100 nm must be etched on the basis of an etching rate of each of the metal layers, however, the first gate metal layer 151 is relatively thinly deposited, so that it is formed to a thinner thickness than the reference etching rate and is etched by about 40 nm in the present embodiment. Accordingly, an electric field at the corner of the gate can be reduced to reduce a leakage current of the TFT.

Figure 5A:
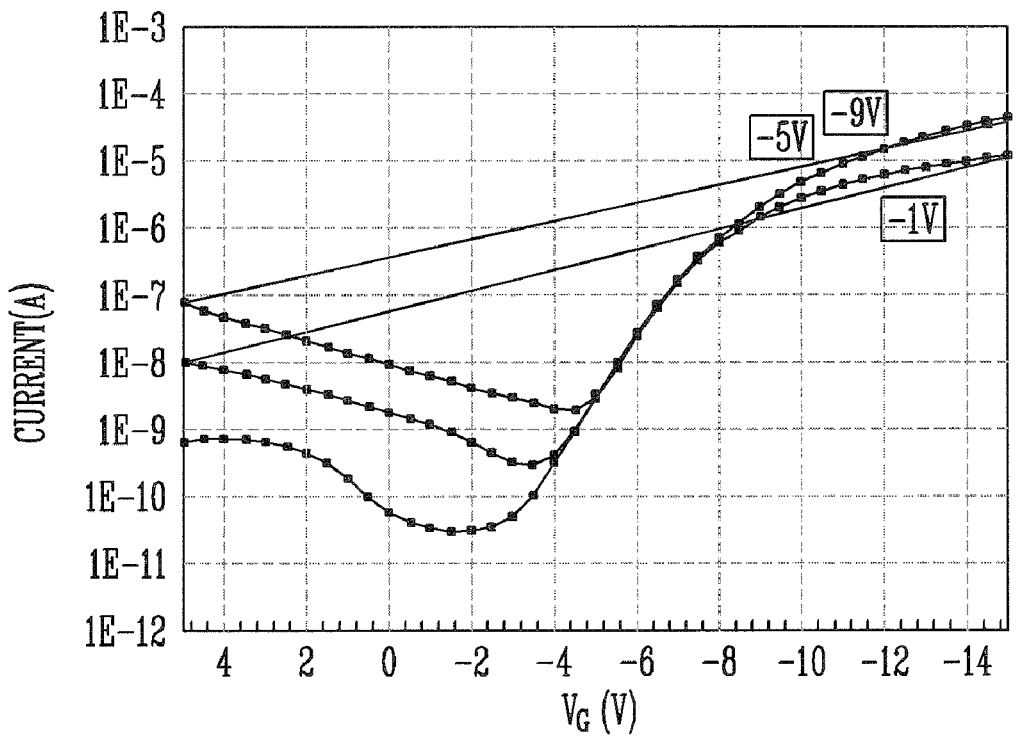
FIG. 5A is a graph illustrating changes in characteristics of a TFT fabricated by the conventional method.
Figure 5B:
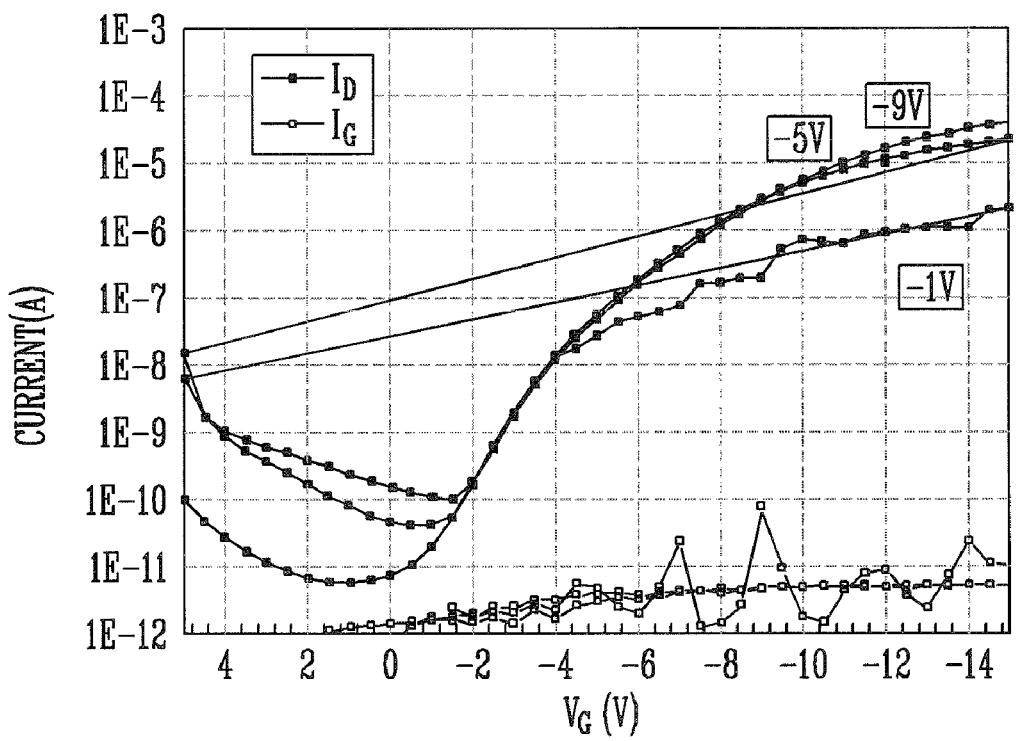
FIG. 5B is a graph illustrating changes in characteristics of a TFT fabricated by the present invention.

FIG. 5A is a graph illustrating changes in characteristics of a TFT fabricated by the conventional method, and FIG. 5B is a graph illustrating changes in characteristics of a TFT fabricated by the present invention.

Referring to FIGS. 5A and 5B, a horizontal axis denotes a gate voltage and a vertical axis denotes a current. Comparing FIG. 5A with FIG. 5B, it can be found that the leakage current is relatively lower than the TFT fabricated by the conventional method when a plurality of metal layers are stacked on the plastic substrate to fabricate a gate electrode in accordance with the present invention.

FIGS. 6A to 6E are views illustrating a process of fabricating a TFT in accordance with a second embodiment of the present invention. The same reference symbols refer to the same constitutional components as the active matrix display device according to the first embodiment illustrated in FIGS. 2A to 2E, and some of the constitutional components refer to the description of FIGS. 2A to 2E.

Figure 6A:
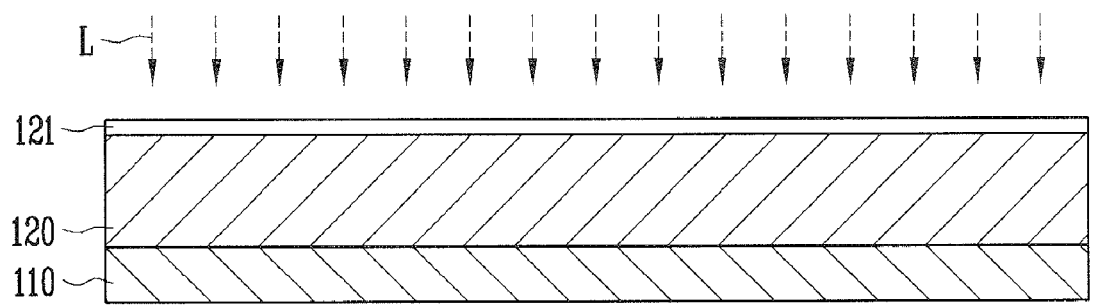
FIGS. 6A to 6E are views illustrating a process of fabricating a TFT in accordance with a second embodiment of the present invention.

Referring to FIG. 6A, in order to fabricate an active matrix display device 600 according to the second embodiment of the present invention, a plastic substrate 110 is first prepared, and a buffer insulating layer 120 is formed on the plastic substrate 110. The buffer insulating layer 120 may be formed of oxide or nitride. After amorphous silicon to be used for an active layer is deposited on the substrate 110 where the buffer insulating layer 120 is already formed, a crystallization method using a laser or the like is employed to obtain a transformed polysilicon layer 121.

Figure 6B:
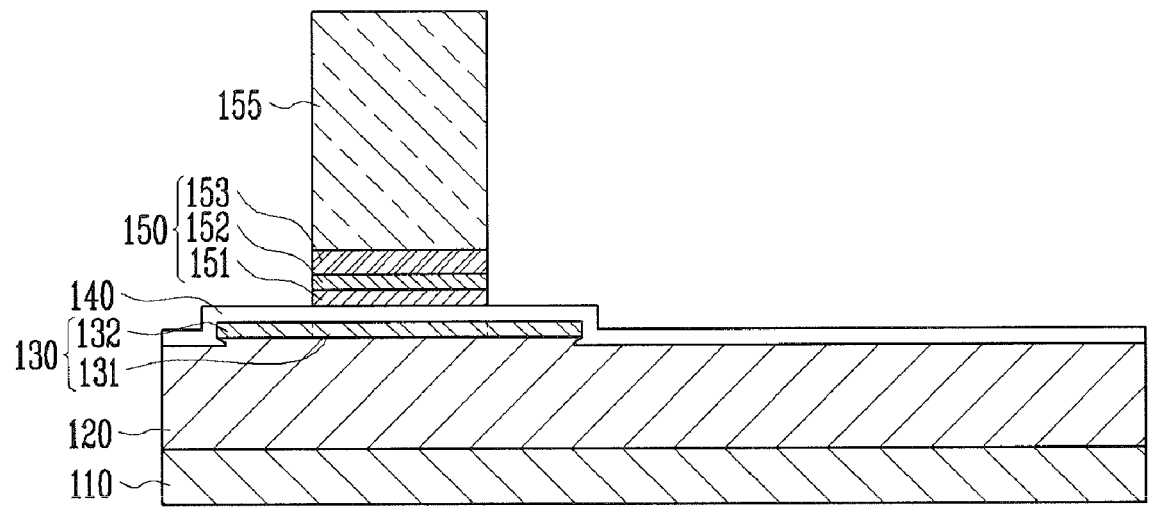
Figure 6C:
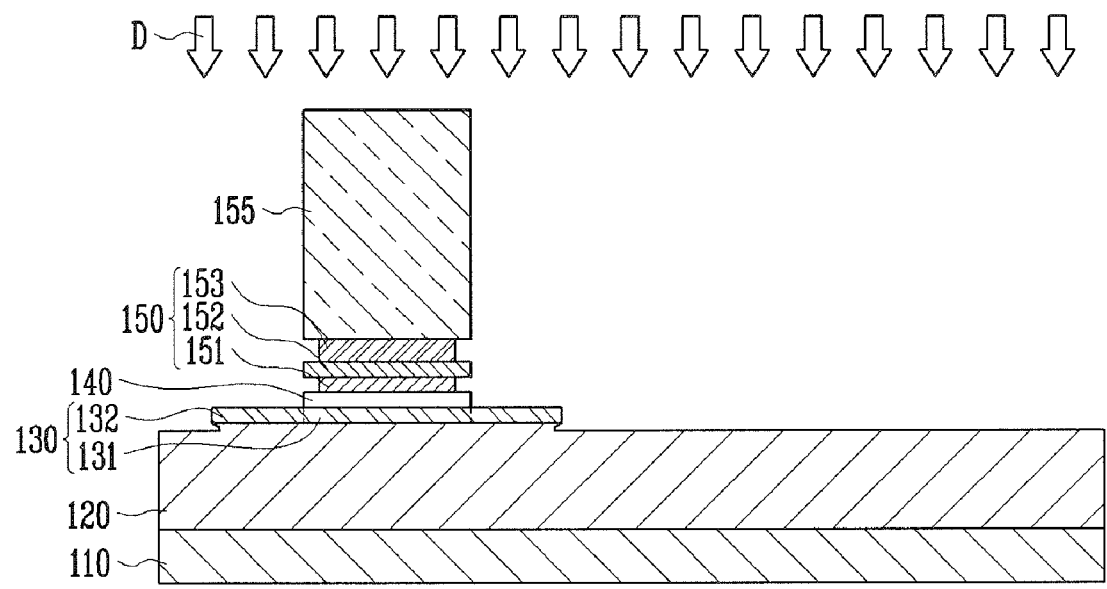
Figure 6D:
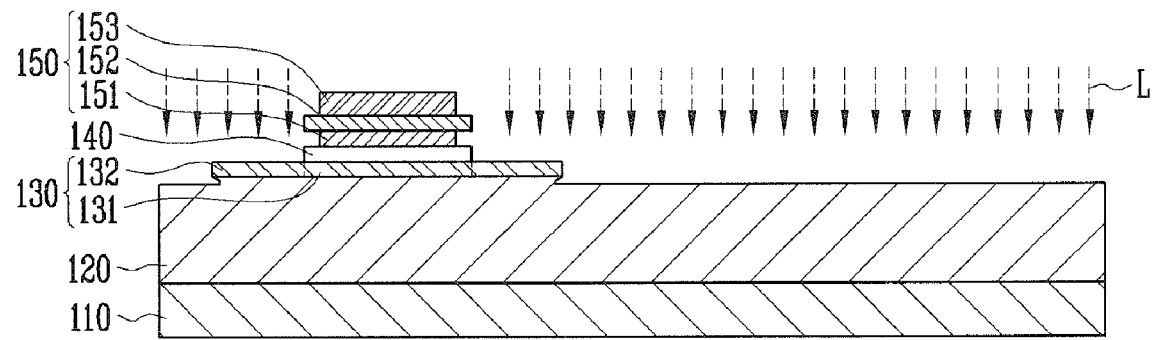
Figure 6E:
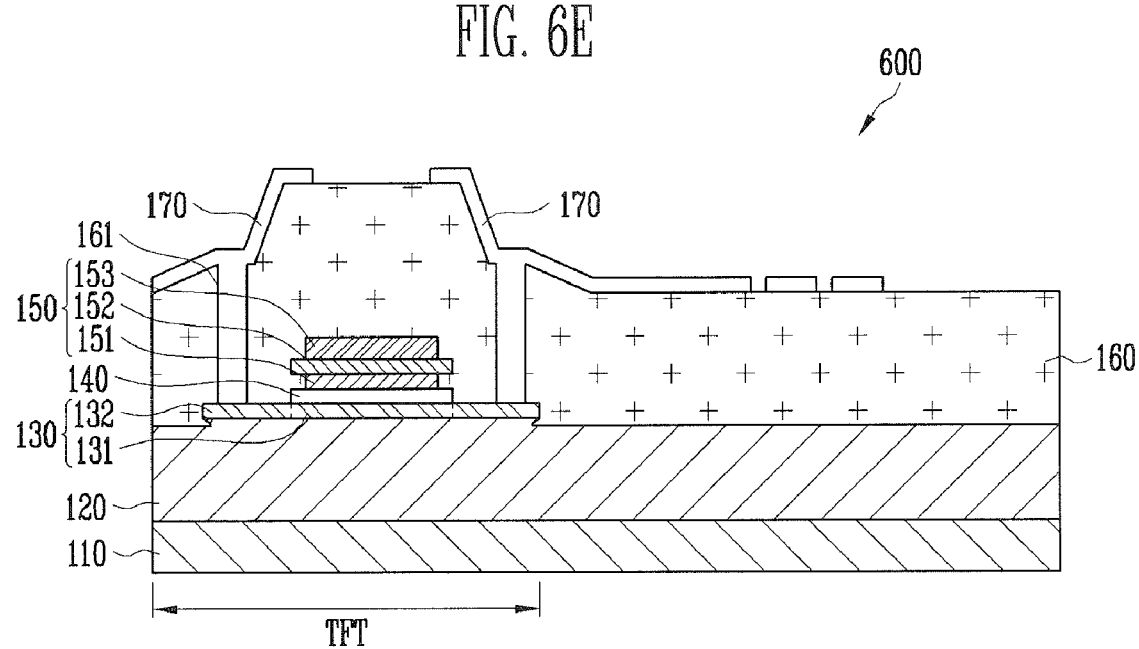

Referring to FIG. 6B, the polysilicon layer 121 is patterned to form an active layer 130, and a gate dielectric layer 140 is deposited on the patterned active layer 130. A gate metal layer 150 is formed on the gate dielectric layer 140. The gate metal layer 150 is composed of triple layers in the present embodiment, and a first gate metal layer 151 is formed on the gate dielectric layer 140. The first gate metal layer 151 is deposited to a thickness of about 100 Å to about 1000 Å. Any one of silver, aluminum, a silver alloy, and an aluminum alloy, which have good reflectivities, is used for the first gate metal layer, and A1 is used for the deposition in the present embodiment. In this case, the greater the first gate metal layer 151 has a thickness, the smaller the corner of the gate electrode has an electric field, thereby obtaining an effect of reducing a leakage current. A second gate metal layer 152 is formed on the first gate metal layer 151, and a third gate metal layer 153 is formed on the second gate metal layer 152.

The second gate metal layer 152 is preferably deposited to a thickness enough to endure a post annealing process, and is most preferably deposited to a thickness of 100 Å to 300 Å. The deposition thickness of the third gate metal layer 153 is adjusted so as to have source and drain resistances meet a design specification, and is preferably 1000 Å to 3000 Å. In the present embodiment, the second gate metal layer 152 is formed of any one of Cr and Mo. At this time, the third gate metal layer 153 is preferably formed of a material having a good reflectivity with respect to laser light compared to second gate metal layer 152, and the first gate metal layer 151 and the second gate metal layer 152, and the second gate metal layer 152 and the third gate metal layer 153, must have good wet etching selectivities, respectively.

After a photosensitive layer 155 is deposited on the third gate metal layer 153, a photo process is used to pattern the first gate metal layer 151 to the third gate metal layer 153. When the first gate metal layer 151 to the third gate metal layer 153 are patterned, the gate dielectric layer 140 is patterned together. The photosensitive layer 155 is formed by a spin-coating method in the present embodiment. The patterned third gate metal layer 153, the patterned second gate metal layer 152, and the patterned first gate metal layer 151 are then etched.

In the next step, the gate dielectric layer 140 is etched. After the gate dielectric layer 140 is etched, a doping process is performed to form doped source and drain regions 132. Ion shower doping (D) is performed in the present embodiment. The photosensitive layer 155 is then removed, and after the photosensitive layer 155 is removed, an activation step using a laser (L) is performed to activate the doped source and drain regions 132. The patterned first gate metal layer 151 and the patterned third gate metal layer 153 are then selectively wet-etched. During the etching process, since the first gate metal layer 151 is deposited to a thin thickness, the first gate metal layer 151 must be etched for a longer time, e.g., about 5 minutes to about 30 minutes, than the known etching rate. Meanwhile, when the third gate metal layer 153 and the first gate metal layer 151 are formed of the same metal, they may be simultaneously etched.

In the next step, an ILD 160 is formed on the gate electrode. After a contact hole 161 is formed on the ILD 160, a source and drain metal 170 is formed on the ILD 160 to be in contact with the source and drain regions 132 through the contact hole 161. Accordingly, the TFT is fabricated. Although not described above, a capacitor and an OLED may be fabricated along with the fabrication of the TFT.

According to embodiments of the present invention as described above, when an active matrix display device including a multilayered gate electrode having a gate electrode layer with an etched corner is fabricated on a plastic substrate, an electric field of the etched corner can be reduced so that a leakage current of a TFT can be reduced.

Also, the characteristics of an active matrix display device can be enhanced by enhancement of the characteristics of the TFT including the multilayered gate electrode.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. A method of fabricating a thin film transistor, comprising:
preparing a substrate formed of plastic;
forming a buffer insulating layer on the plastic substrate;
forming a silicon layer on the buffer insulating layer;
patterning the silicon layer to form an active layer;
forming a gate insulating layer on the active layer;
stacking a plurality of gate metal layers on the gate insulating layer;
patterning the plurality of gate metal layers; and
etching selectively to undercut away a portion of a corner region of the lowest gate metal layer formed on the gate insulating layer of the patterned gate metal layers and to leave a portion of a higher metal gate layer laterally overhanging the lowest gate metal layer,
wherein the higher metal gate layer is above the lowest metal gate layer.

2. The method according to claim 1, wherein the etching step also selectively etches away a portion of a corner region of a highest gate metal layer in which the highest gate metal layer is above the higher metal gate layer such that the etching step results in the overhanging portion of the higher metal gate layer laterally extending beyond the highest gate metal layer.

3. The method according to claim 1, wherein the highest gate metal layer of the plurality of gate metal layers is formed of a material having a high reflectivity.

4. The method according to claim 3, wherein the material having the high reflectivity comprises one of Al, Ag, an Al alloy and an Ag alloy.

5. The method according to claim 1, wherein the gate metal layer in direct contact with the lowest gate metal layer of the plurality of gate metal layers is formed of a different material from the lowest gate metal layer.

6. The method according to claim 1, wherein the lowest gate metal layer is directly on the gate insulating layer of the patterned gate metal layers.

7. The method according to claim 1, wherein the higher metal gate layer is above and directly on the lowest metal gate layer.

8. The method according to claim 2, wherein the highest metal gate layer is above and directly on the higher metal gate layer.

9. The method according to claim 1, wherein the number of gate metal layers is more than three.

10. The method according to claim 1, wherein the lowest metal gate layer is selected from the group consisting of chromium and molybdenum.

11. The method according to claim 1, wherein the higher metal gate layer is selected from the group consisting of aluminum, silver, and alloys thereof.

12. The method according to claim 2, wherein the highest metal gate layer is selected from the group consisting of aluminum, silver, and alloys thereof.

13. The method according to claim 1, wherein the silicon layer is a polysilicon layer.

14. The method according to claim 1, wherein the buffer insulating layer is selected from the group consisting of an oxide buffer insulating layer and a nitride buffer insulating layer.

* * * * *